US012784363B2

(12) United States Patent
Doll et al.

(10) Patent No.: US 12,784,363 B2
(45) Date of Patent: Nov. 3, 2026

(54) DISPLAY NOTIFICATION FOR LIGHTWEIGHT VIEWER

(71) Applicant: RTX CORPORATION, Farmington, CT (US)

(72) Inventors: Stephen Doll, Ponte Vedra, FL (US); Michael P. Brown, Farmington, CT (US)

(73) Assignee: RTX CORPORATION, Farmington, CT (US)

( * ) Notice: Subject to any disclaimer, the term of this patent is extended or adjusted under 35 U.S.C. 154(b) by 229 days.

(21) Appl. No.: 18/467,921

(22) Filed: Sep. 15, 2023

(65) Prior Publication Data

US 2025/0095294 A1 Mar. 20, 2025

(51) Int. Cl.

| | |
|---|---|
| ***G06T 17/20*** | (2006.01) |
| ***G06F 3/0482*** | (2013.01) |
| ***G06F 3/04842*** | (2022.01) |
| ***G06F 30/10*** | (2020.01) |

(52) U.S. Cl.

CPC ............ *G06T 17/20* (2013.01); *G06F 3/0482* (2013.01); *G06F 3/04842* (2013.01); *G06F 30/10* (2020.01); *G06T 2200/24* (2013.01); *G06T 2210/32* (2013.01)

(58) Field of Classification Search

CPC ..... G06T 17/20; G06T 19/20; G06T 2200/24; G06T 2210/32; G06F 3/0482; G06F 3/04842; G06F 30/00; G06F 30/10; G06F 30/12; G06F 30/17

USPC .......................................................... 345/423

See application file for complete search history.

(56) References Cited

U.S. PATENT DOCUMENTS 7,613,539 B2 11/2009 Bae et al.
7,688,318 B2 3/2010 O'Malley et al.
8,400,446 B2 3/2013 Gatzke et al.
8,922,576 B2 12/2014 Hickman et al.
9,152,435 B2 10/2015 Williamson
(Continued)

FOREIGN PATENT DOCUMENTS

CN 115099431 9/2022
KR 20220100285 7/2022

OTHER PUBLICATIONS

Alexander Ball et al., Lightweight Formats for Product Model Data Exchange and Preservation, Research Gate, https://www.researchgate.net/publication/228969354, Jan. 2007, pp. 1-7, including cover sheet.*

(Continued)

*Primary Examiner* — Jacinta M Crawford

(74) *Attorney, Agent, or Firm* — Carlson, Gaskey & Olds, P.C.

(57) ABSTRACT

A user interface for a lightweight viewer may include, among other things, a viewing window operable to display geometry established by one or more of geometric objects of a tessellated model and a plurality of notification objects of the tessellated model. The notification objects include a first statement object and an acknowledgement object linked to the first statement object. The first statement object is operable to establish a first notification screen that blocks display of the geometry in the viewing window prior to selection of the acknowledgement object but permits display of the geometry in response to selection of the acknowledgement object. A method of establishing a tessellated model is also disclosed.

21 Claims, 10 Drawing Sheets

(56) References Cited

U.S. PATENT DOCUMENTS

| | | | | |
|---|---|---|---|---|
| 9,305,390 | B2 | 4/2016 | Schlichte et al. | |
| 9,761,045 | B1 | 9/2017 | Cote et al. | |
| 9,870,436 | B2 | 1/2018 | Lorono et al. | |
| 9,886,530 | B2 | 2/2018 | Mehr et al. | |
| 10,031,640 | B2 | 7/2018 | Hilton et al. | |
| 10,121,286 | B2 | 11/2018 | Alsaffar et al. | |
| 10,872,465 | B2 | 12/2020 | Cochrane et al. | |
| 11,308,245 | B2 | 4/2022 | Yang et al. | |
| 11,429,756 | B2 | 8/2022 | Birkett-Smith et al. | |
| 11,810,659 | B2 | 11/2023 | Imasugi et al. | |
| 11,893,312 | B2 | 2/2024 | Baran et al. | |
| 2006/0066609 | A1 * | 3/2006 | Iodice ..................... | G06T 19/20 345/419 |
| 2022/0198077 | A1 | 6/2022 | Mora et al. | |

OTHER PUBLICATIONS

Z. M. Qiu et al., Geometric model simplification for distributed CAD, Computer-Aided Design, vol. 36, Issue 9, Aug. 2004, pp. 809-819.*

European Search Report for European Patent Application No. 24200412.5 mailed Jan. 29, 2025.

Qiu, Z.M., Kok, K.F., Wong, Y.S., Fuh, J.Y.H. (2007). Role-based 3D visualisation for asynchronous PLM collaboration. Computers in Industry. vol. 58. 2007. pp. 747-755.

Youtube. "AutoCAD 3D View in PDF with Bentley View" Mafasu Cad. Mar. 16, 2016. Retrieved Jan. 15, 2025 from: https://www.youtube.com/watch?v=tCob3yy6zr4.

Youtube. "How to Create a Technical Data Package" Transmagic, Inc. Jun. 30, 2020. Retrieved Jan. 15 from: https://www.youtube.com/watch?v=7yla0tYFZhg.

Youtube. "Publishing 3D Data to PDF, CAD Standards and HTML" Tech Soft 3d. Nov. 11, 2017. Retrieved Jan. 15, 2025 from: https://www.youtube.com/watch?v=Zp0Hf2iMzRg&t=12s.

3D (3D Settings). Adobe Acrobat. Retrieved Dec. 1, 2025 from: https://www.adobe.com/devnet-docs/acrobatetk/tools/PrefRef/Windows/3D.html.

Interacting with 3D models. Adobe Acrobat. Retreived Dec. 1, 2025 from: https://helpx.adobe.com/acrobat/using/interacting-3d-models.html.

Displaying 3D models in PDFs. Adobe Acrobat. Retrieved Dec. 1, 2025: https://helpx.adobe.com/acrobat/using/displaying-3d-models-pdfs.html.

* cited by examiner

DISPLAY NOTIFICATION FOR LIGHTWEIGHT VIEWER

BACKGROUND

This disclosure relates to modeling and interaction with the design of various components.

Computer-Aided Design (CAD) systems are known and may be utilized to generate two-dimensional and three-dimensional (3D) models of various components. The associated CAD files may be relatively large, which may impede transfer to other computing systems. A lightweight, tessellated representation of the CAD model may be generated and stored within a file that excludes the original CAD model. The file may be saved in a Portable Document Format (PDF) or another file format. A lightweight viewer may be utilized to view the lightweight representation.

SUMMARY

A user interface for a lightweight viewer according to an example of the present disclosure includes a viewing window operable to display geometry established by one or more of geometric objects of a tessellated model and a plurality of notification objects of the tessellated model. The notification objects include a first statement object and an acknowledgement object linked to the first statement object. The first statement object is operable to establish a first notification screen that blocks display of the geometry in the viewing window prior to selection of the acknowledgement object but permits display of the geometry in response to selection of the acknowledgement object.

In a further embodiment of any of the foregoing embodiments, the first statement object is operable to display one or more notifications in the first notification screen. The first notification screen and the acknowledgement object are arranged in a common display region.

In a further embodiment of any of the foregoing embodiments, the acknowledgement object is operable to deactivate the first notification screen in response to selection of the acknowledgement object.

In a further embodiment of any of the foregoing embodiments, the one or more geometric objects are associated with one or more display layers operable to depict the geometry in the viewing window. The first statement object is associated with a statement layer operable to display information in the first notification screen. The acknowledgement object is operable to block activation of the one or more of the display layers prior to selection of the acknowledgement object. The acknowledgement object is operable to permit activation of the one or more display layers in response to selection of the acknowledgement object.

In a further embodiment of any of the foregoing embodiments, the one or more display layers includes a default layer associated with a depiction of the geometry established by the one or more of geometric objects. The acknowledgement object is operable to activate the default layer.

A further embodiment of any of the foregoing embodiments includes an information window established by a plurality of content objects of the tessellated model. The content objects associated with respective content layers of the tessellated model that occupy a common display region are operable to selectively display information associated with the tessellated model in response to user interaction with the respective content object such that the respective content layer is activated but a remainder of the content layers are deactivated in the common display region. One or more of the content layers are deactivated prior to selection of the acknowledgement object. The acknowledgement object is operable to block activation of the one or more of the content layers prior to selection of the acknowledgement object but is operable to permit activation of the one or more of the content layers in response to selection of the acknowledgement object.

A further embodiment of any of the foregoing embodiments includes a navigation window operable to display one or more view objects. The one or more view objects are associated with a respective depiction of the one or more geometric objects. The viewing window is operable to display the depiction in response to user interaction with the respective view object. The notification objects include a second statement object linked to the acknowledgement object. The second statement object is operable to establish a second notification screen that blocks display of the one or more view objects in the navigation window prior to selection of the acknowledgement object.

In a further embodiment of any of the foregoing embodiments, the second statement object is operable to deactivate the second notification screen in response to selection of the acknowledgement object.

In a further embodiment of any of the foregoing embodiments, the notification objects include a review object linked to the acknowledgement object. The review object is hidden prior to selection of the acknowledgement object but is displayed in response to selection of the acknowledgement object. The review object is operable to cause the first statement object to display the first notification screen in response to user interaction.

In a further embodiment of any of the foregoing embodiments, the tessellated model excludes any CAD model associated with the geometry.

A system for generating a tessellated model according to an example of the present disclosure includes a computing device that has one or more processors coupled to memory. The computing device is operable to execute a modeling environment. The modeling environment is operable to access a computer-aided design (CAD) model associated with geometry, generate one or more geometric objects that establish a tessellation of the geometry, and generate a plurality of notification objects. The notification objects have a first statement object and an acknowledgement object linked to the first statement object. The modeling environment is operable to generate a tessellated model including the one or more geometric objects and the notification objects. The one or more geometric objects are operable to display the tessellation of the geometry in a viewing window of a user interface. The first statement object is operable to establish a first notification screen that blocks display of the viewing window prior to selection of the acknowledgement object but permits display of the viewing window in response to selection of the acknowledgement object.

In a further embodiment of any of the foregoing embodiments, the acknowledgement object is operable to deactivate the first notification screen in response to selection of the acknowledgement object. The acknowledgement object is operable to activate a depiction of the geometry established by the one or more of geometric objects in the viewing window in response to selection of the acknowledgement object.

In a further embodiment of any of the foregoing embodiments, the modeling environment is operable to generate one or more view objects associated with a navigation window of the user interface. The one or more view objects are associated with a respective depiction of the one or more geometric objects. The viewing window is operable to display the depiction in response to selection of the respective view object. The tessellated model includes the one or more view objects. The notification objects include a second statement object linked to the acknowledgement object. The second statement object is operable to establish a second notification screen that blocks display of the one or more view objects in the navigation window prior to selection of the acknowledgement object.

In a further embodiment of any of the foregoing embodiments, the modeling environment is operable to generate a plurality of content objects. The tessellated model includes the content objects. The content objects are operable to establish an information window in the user interface. The content objects are associated with respective content layers of the tessellated model that occupy a common display region. The content objects are operable to selectively display information associated with the tessellated model in the respective content layers. One or more content layers are deactivated prior to selection of the acknowledgement object. The acknowledgement object is operable to block activation of the one or more content layers prior to selection of the acknowledgement object but is operable to permit activation of the one or more content layers in response to selection of the acknowledgement object.

In a further embodiment of any of the foregoing embodiments, the modeling environment is operable to store the tessellated model in a file readable by a lightweight viewer. The file excludes the CAD model.

In a further embodiment of any of the foregoing embodiments, the modeling environment is operable to store code in the file that is operable to cause one or more functions associated with the tessellated model to execute in the lightweight viewer.

A method of establishing a tessellated model according to an example of the present disclosure includes generating one or more geometric objects that establish a tessellation of geometry stored in a computer-aided design (CAD) model. The one or more geometric objects are operable to display the tessellation of the geometry in a viewing window of a user interface. The method includes generating a plurality of notification objects. The notification objects have a first statement object and an acknowledgement object linked to the first statement object. The first statement object is operable to establish a first notification screen that blocks display of the viewing window prior to selection of the acknowledgement object but permits display of the viewing window in response to selection of the acknowledgement object. The method includes generating a tessellated model including the one or more geometric objects and the notification objects.

A further embodiment of any of the foregoing embodiments includes assigning one or more notifications to the first statement object. The first statement object is operable to display the one or more notifications in the first notification screen. The first notification screen and the acknowledgement object are arranged in a common display region of the user interface.

In a further embodiment of any of the foregoing embodiments, the acknowledgement object is operable to deactivate the first notification screen in response to selection of the acknowledgement object. The acknowledgement object is operable to activate a depiction of the geometry established by the one or more of geometric objects in the viewing window in response to selection of the acknowledgement object.

A further embodiment of any of the foregoing embodiments includes storing the tessellated model in at least one file that excludes the CAD model.

A further embodiment of any of the foregoing embodiments includes displaying the tessellated model in a lightweight viewer.

The present disclosure may include any one or more of the individual features disclosed above and/or below alone or in any combination thereof.

The various features and advantages of this disclosure will become apparent to those skilled in the art from the following detailed description. The drawings that accompany the detailed description can be briefly described as follows.

BRIEF DESCRIPTION OF THE DRAWINGS

Like reference numbers and designations in the various drawings indicate like elements.

DETAILED DESCRIPTION

Display space in a model-based definition (MBD) lightweight viewer used to render a tessellated model may be limited. The geometric model may be associated with many requirements which may need to be presented to the user in a user interface. Showing all the information simultaneously may exceed the amount of display space that may be available in the user interface. Upon opening a file in the viewer, sensitive information may be shown prior to a user acknowledging that they have permission to view the information in the file.

Disclosed are techniques for covering or otherwise obfuscating model geometry and/or other sensitive information in the user interface prior to obtaining user acknowledgment, which may deter unauthorized users from referencing the information. The tessellated model may establish one or more notification screens or windows that may hide sensitive data in the display window(s) of a lightweight viewer until a user acknowledges that they have read all statements presented. The notification screen may include any number of statements. Application programming interface (API) functions may be used to create the notification screens and means for acknowledgment. The API may not include the notification screens, but it may support field objects configured to depict the notification screens. The field objects may be utilized to establish the notification screens. The notification screen and model geometry may be associated with different layers in the same window area, but a single layer may be selectively visible at a time. The notification screen once acknowledged may be hidden to expose the model geometry and other sensitive information. The notification screen may provide an area for statements without reducing the limited area of the geometric model viewing planes. The code (e.g., script) to generate the notification screens and acknowledgement means may be embedded within the same tessellated file associated with the tessellated geometry. The tessellated file may be stored in a lightweight format, such as a Portable Document File (PDF) format. Accordingly, the lightweight viewer does not have to be programmed to support notifications and any lightweight viewer that supports the file format may access the model and notifications.

Figure 1:
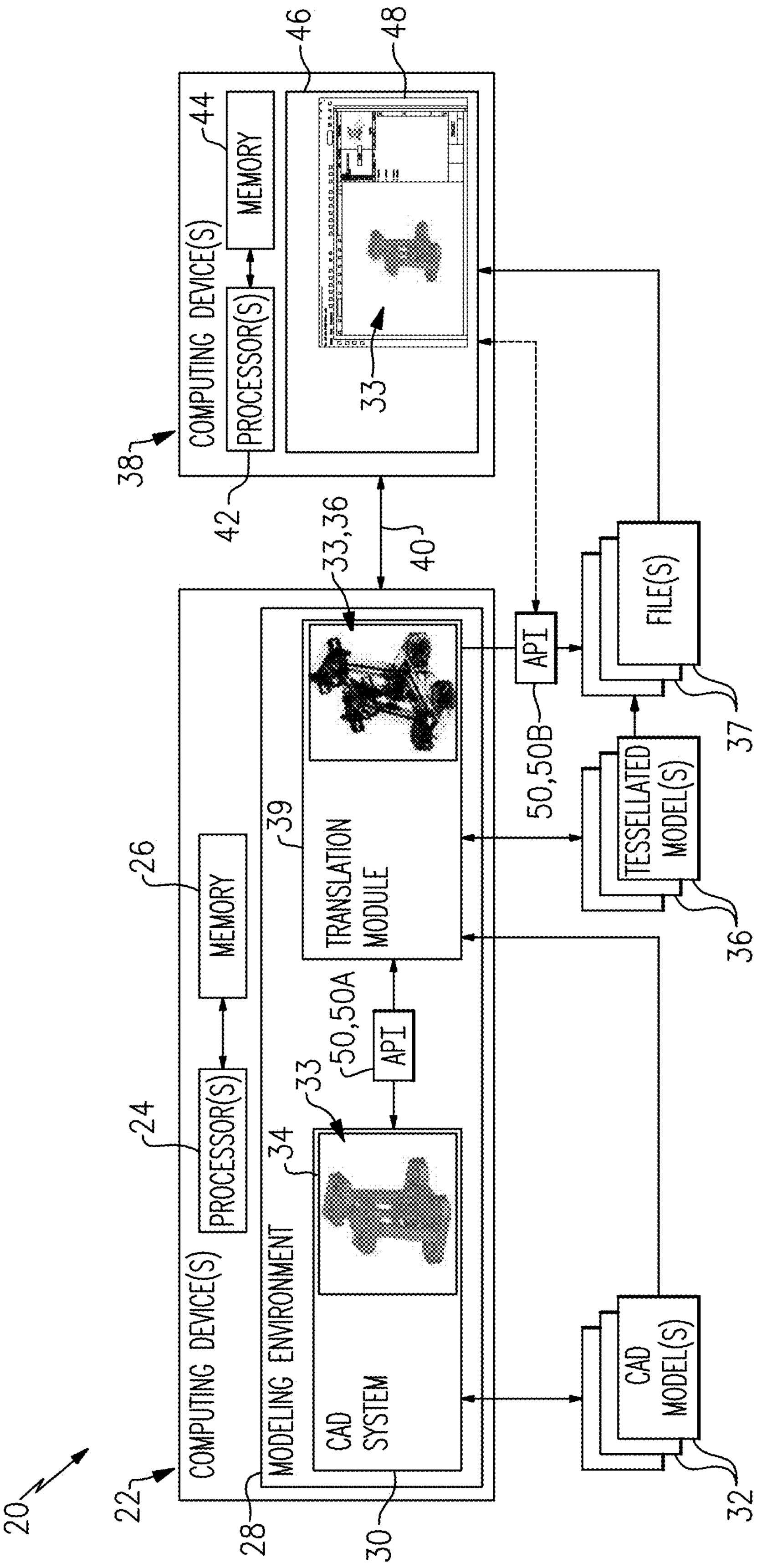
FIG. 1 discloses a modeling system.

FIG. 1 discloses a modeling system 20. The modeling system 20 may be operable to interact with one or more computer-aided design (CAD) models. The modeling system 20 may be operable to generate one or more tessellated models from the CAD model(s). The tessellated model may be relatively compact and may include a lesser amount of data compared to the CAD model. The tessellated model may represent CAD geometry as a set of facets (e.g., triangles) that may be patched together (see, e.g., FIG. 2). Each of the facets may be defined by three respective points of a point cloud. The features disclosed herein may be incorporated into, or may otherwise be utilized with, a lightweight viewer. The tessellated models may be viewable in the lightweight viewer. For the purposes of this disclosure, a "lightweight viewer" is a software application suitable to view tessellated models. The lightweight viewer may be operable to view and interact with, but not edit, the tessellated model. Lightweight viewers may include a 3D PDF or HTML viewer or another viewer such as JT2Go operable to access tessellated models stored in a lightweight file format.

The modeling system 20 may include at least one computing device 22. The computing device 22 may include one or more processors 24 coupled to memory 26. The computing device 22 may be operable to execute a modeling environment (e.g., tool) 28. The modeling environment 28 may incorporate or may otherwise interface with a CAD system 30 (e.g., CATIA, AutoCAD, Solidworks, Siemens NX, etc.). The CAD system 30 and/or another portion of the modeling environment 28 may be operable to access one or more CAD models 32. Each of the CAD models 32 may be associated with geometry. The geometry may be associated with one or more virtual and/or physical components, assemblies and/or systems. The CAD system 30 may be operable to display one or more of the CAD models 32 in a user interface 34.

A user may desire to share or otherwise communicate information associated with the design to one or more other users, such as another member of a development team, a customer, or a supplier. The modeling environment 28 may be operable to generate one or more tessellated models 36, which may have a relatively lesser amount of information than the associated CAD model(s) 32 for communication to the other users. The tessellated model 36 may be stored in one or more lightweight files 37. The CAD model 32 and tessellated model 36 may be associated with geometry 33 (e.g., FIGS. 2 and 4A). The tessellated model 36 may exclude the exact CAD geometry and/or any CAD model 32 associated with the geometry 33.

Figure 2:
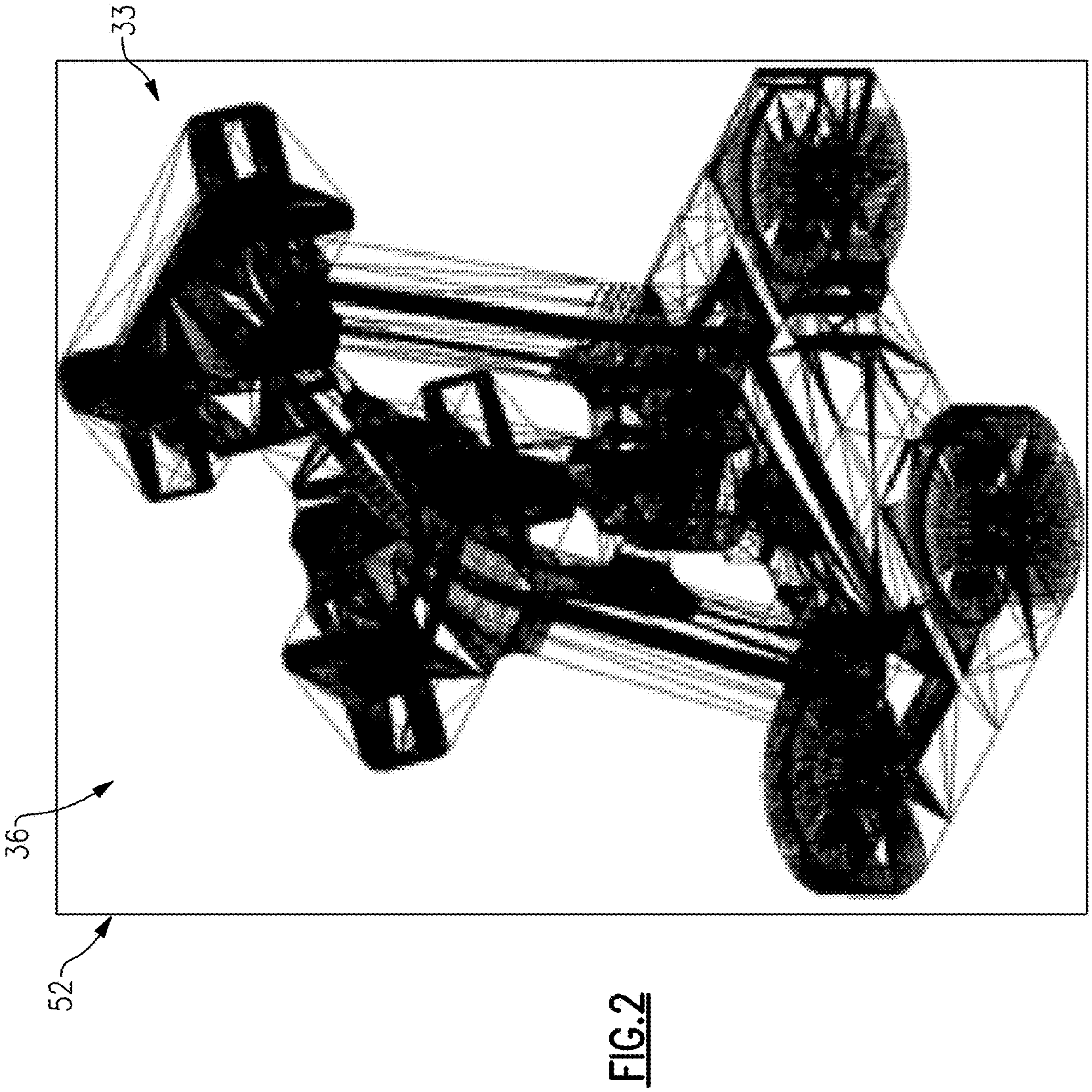
FIG. 2 discloses a graphical depiction of a tessellated model.

Various users may access and review the tessellated models 36 in a lightweight viewer. Various lightweight viewers may be utilized, such as Adobe which may be operable to access PDF files. The lightweight viewer may be operable to access and view lightweight files containing tessellated models but not any files containing CAD models, including the exact CAD geometry. In other implementations, the modeling environment 28 may be operable to store the tessellated model 36 and the exact CAD geometry in the same file. Each of the tessellated models 36 may be associated with one or more respective CAD models 32 that store the exact CAD geometry and related information. FIG. 2 discloses a graphical depiction of a tessellated model 36 according to an implementation. The specific geometry of the depicted tessellated model 36 is not intended to limit this disclosure.

The modeling environment 28 may be operable to access and display each of the tessellated models 36. In implementations, one or more (e.g., client) computing devices 38 may be operable to access the tessellated models 36. The computing devices 22, 38 may include one or more computer processors, memory, storage means, network devices, input and/or output devices, and/or interfaces. The computing devices 22, 38 may be operable to execute one or more software programs, including one or more portions of the modeling environment 28. The computing devices 22, 38 may be operable to communicate with one or more networks established by one or more computing devices. The memory may include UVPROM, EEPROM, FLASH, RAM, ROM, DVD, CD, a hard drive, or other computer readable medium which may store data and/or the functionality of this description. The computing devices 22, 38 may be a desktop computer, laptop computer, smart phone, tablet, or any other computer device. Input devices may include a keyboard, mouse, touchscreen, etc. The output devices may include a monitor, speakers, printers, etc. Each of the computing devices 38 may include one or more processors 42 coupled to memory 44. The computing device 38 may be coupled to the computing device 22 by connection(s) 40. The connection 40 may be a wired and/or wireless connection. The connection 40 may be established over one or more networks and/or other computing systems.

The processor 42 of the computing device 38 may be operable to execute a lightweight viewer 46. The lightweight viewer 46 may be a separate software application executable by the computing device 38 or may be a service provided by the computing device 22 which may be accessible by a thin client or browser over a network connection. The lightweight viewer 46 may be operable to access the tessellated models 36. The lightweight viewer 46 may be displayed in a display device. The lightweight viewer 46 may include a graphical user interface (GUI) 48 operable to display the tessellated model 36. The lightweight viewer 46 may be operable to read tessellated models 36 but not any CAD models 32, including CAD models 32 relating to geometry associated with the tessellated models 36.

Various techniques may be utilized to establish the tessellated models 36. The modeling environment 28 may be operable to generate one or more objects (e.g., elements), including any of the objects disclosed herein. In implementations, the objects may be field objects. The tessellated model 36 may include one or more field objects. The field objects and associated contents may be embedded within the tessellated model 36. The modeling environment 28 may include, or may otherwise interface with, one or more application programming interfaces (API) 50. In the implementation of FIG. 1, the system 20 may include or otherwise interface with a first API 50A and a second API 50B. The functionality of the APIs 50A, 50B may be incorporated into a single API 50 or may be distributed between three or more APIs 50. The CAD system 30 and/or lightweight viewer 46 may be operable to interact with the respective CAD models 32 and tessellated models 36 according to the API 50. The lightweight viewer 46 may be configured to recognize objects, function calls, data structures, etc. specified in the API(s) 50. The API 50 may be utilized to establish one or more tessellated models 36. The API 50 may be utilized to convert the CAD models 32 to tessellated models 36. The modeling environment 28 may include a translation module 39 operable to establish tessellated models 36 and/or lightweight files 37. The translation module 39 may be operable to interact with the API 50B to establish (e.g., render) tessellated models 36. The translation module 39 may be operable to interact with the API 50B to establish lightweight files 37 including tessellated model(s) 36 in a format (e.g., data structure) supported by the API 50B and/or lightweight viewer 46. The API 50 may be utilized to assign various information, scripts and other data to one or more fields of the field objects. The field objects may be established according to data structure(s) specified in the API 50. The API 50 may provide the ability to associate scripts with objects of the tessellated model 36. The code (e.g., script) to generate the disclosed features and/or any code that causes any associated functions to occur in the lightweight viewer (e.g., in response to selection of the objects of the model 36) may be embedded within the same lightweight file 37 as the objects of the model 36 associated with the model geometry 33. The scripts and other code may be executed in response to user interaction and/or selection of the respective field object. The script may be specified according to JavaScript or another scripting language supported by the API 50. Storing the code that causes the function(s) associated with the objects and other features in the lightweight file 37 itself allows for the publisher to control the file presentation directly and does not require a special viewer.

Figure 3:
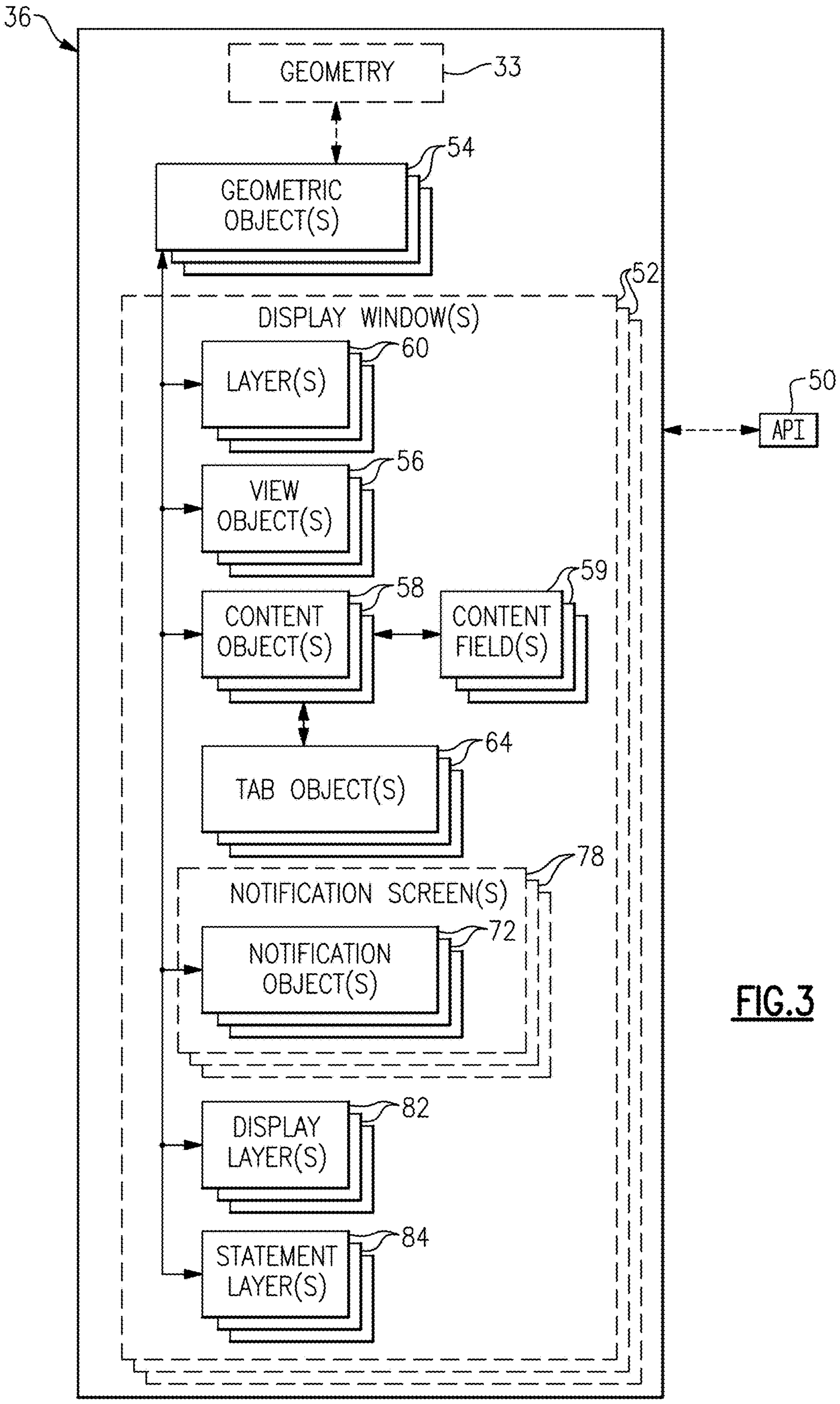
FIG. 3 discloses an arrangement of a tessellated model.

FIG. 3 schematically illustrates a tessellated model 36 according to an implementation. The tessellated model 36 may include any of the objects and associated structures disclosed herein. The tessellated model 36 may be established with respect to one or more data structures specified in the API 50. Various techniques may be utilized to establish relationships between the various objects of the tessellated model 36, including one or more static and/or dynamic links which may be specified in field(s) of the field objects. The API 50 may be utilized to establish the objects and links.

Figure 4A:
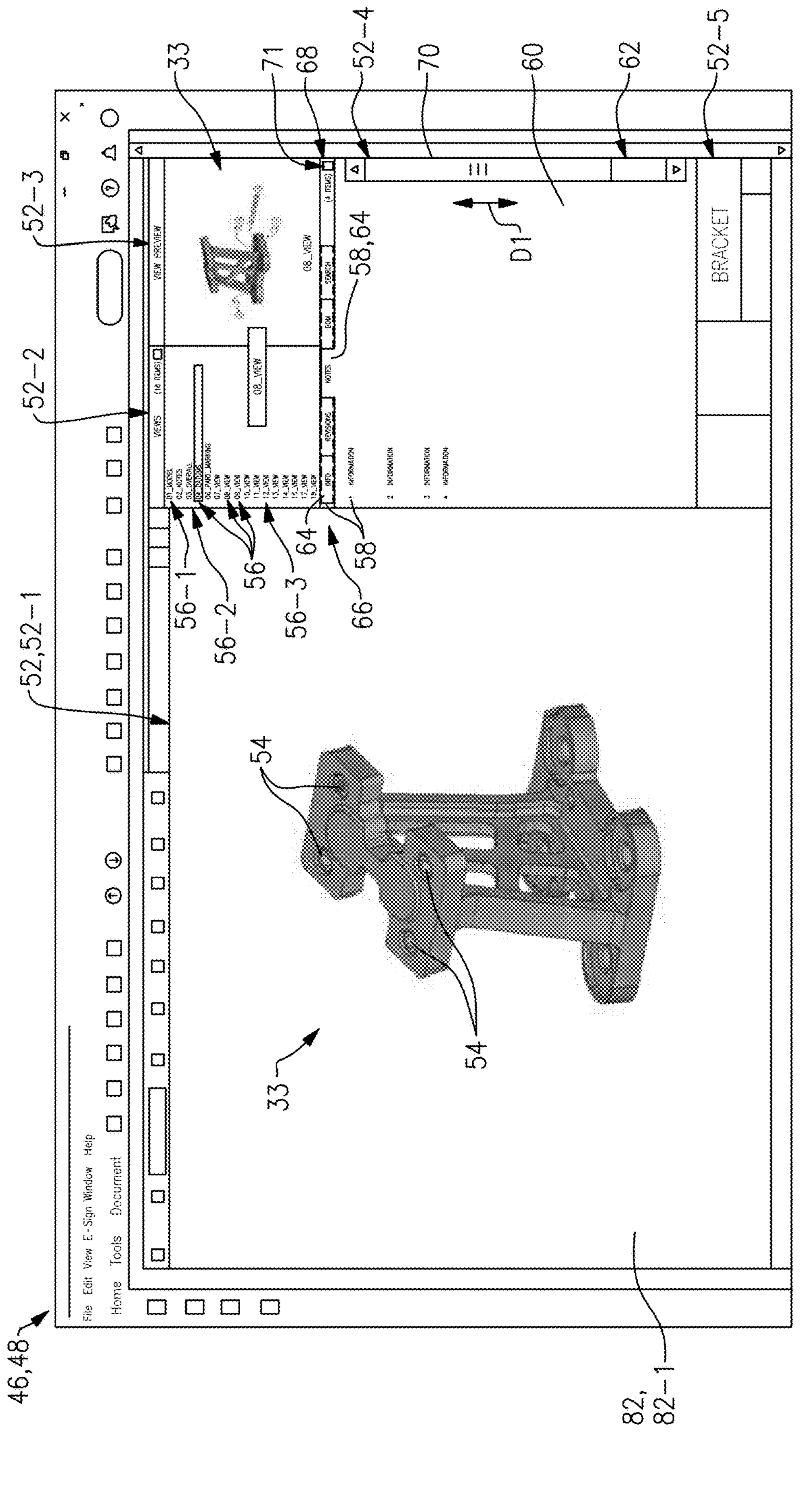
FIG. 4A discloses a graphical user interface for depicting geometry.

Referring to FIG. 4A, with continuing reference to FIGS. 1-3, the tessellated model 36 may establish a user interface 48. The user interface 48 may be suitable for a lightweight viewer, such as lightweight viewer 46, which may display the tessellated model 36 according to the API 50. FIG. 4A discloses an implementation of the lightweight viewer 46. The tessellated model 36 may include the tessellated geometry, information associated or presented with the tessellated geometry, and/or information utilized to establish the user interface 48.

The user interface 48 may be arranged in a manner that may declutter secondary information associated with the design geometry 33 such that a main viewing area may be relatively large. The user interface 48 may include one or more display windows 52 which may serve to divide the user interface 48 into different areas. In the implementation of FIG. 3, the display windows 52 may include a first (e.g., main) viewing window 52-1, a second (e.g., navigation) window 52-2, a third (e.g., preview) window 52-3, a fourth (e.g., information) window 52-4, and a fifth (e.g., information) window 52-5. The information window 52-4 may be a dynamic information window that may dynamically display information. The information may be contextual depending on what view the user may select. The information window 52-5 may be a persistent information window, which may always be visible in the user interface 48 and may display information without change. The information may include the title, part number, document number, etc. that may uniquely identify the design. Although the user interface 48 is shown with five display windows 52, it should be understood that fewer or more than five display windows 52 may be utilized in accordance with the teachings disclosed herein. The viewing window 52-1 and/or preview window 52-3 may be operable to display one or more depictions of the geometry 33. The windows 52-2, 52-4 and/or 52-5 may be operable to display various information relating to the geometry 33 and/or other aspects of the design. In implementations, the window(s) 52 may be operable to display information associated with one or more attributes specified in the lightweight file 37. Attribute(s) may be associated with the geometry 33 and/or depictions (e.g., views) of the geometry 33, but some attribute(s) may be specified at a global (e.g., file) level. The attributes may be specified in a header of the file 37.

The modeling environment 28 may be operable to generate one or more geometric objects 54. The modeling environment 28 may be operable to generate a tessellated model 36 that includes the geometric object(s) 54. The geometric objects 54 may establish a tessellation of geometry 33 (sec, e.g., FIG. 2). The viewing window 52-1, preview window 52-3 and/or another display window 52 may be operable to display geometry 33 established by one or more geometric objects 54 of the tessellated model 36. The geometric objects 54 may be operable to display various depictions of the tessellation of the geometry 33 in the viewing window 52-1 and/or another window 52 of the user interface 48. Each of the geometric objects 54 may be associated with one or more graphics that may depict a geometry of the design. The depictions may include two-dimensional and/or three-dimensional views of the geometry 33 and may include solids, wireframes, transparencies, etc. The modeling environment 28 may be operable to store the tessellated models 36 in one or more lightweight files 37, which may be readable by the lightweight viewer 46. In implementations, the file(s) 37 may exclude any CAD models 32, including any CAD models 32 utilized to establish, or that may otherwise be related to, tessellated model(s) 36 of the respective geometry 33. The modeling environment 28 may be operable to store code (e.g., scripts, function calls, etc.) in the lightweight file 37 that may be operable to cause one or more functions associated with the tessellated model 36 to execute in the lightweight viewer 46, including any of the functions disclosed herein.

The modeling environment 28 may be operable to generate one or more view objects 56. Each of the view objects 56 may be associated with respective depictions of the geometric object(s) 54 associated with the geometry 33. The view objects 56 may be associated with the navigation window 52-2 and/or another window 52 of the user interface 48. The navigation window 52-2 may be operable to display one or more of the view objects 56, which may be depicted in a list. The viewing window 52-1 may be operable to display the depiction in response to user interaction or selection of the respective view object 56.

In implementations, the view objects 56 may include first, second, and third view objects 56-1 to 56-3. The view object 56-1 may be associated with an overall representation of the geometry 33. The second view object 56-2 may be associatedated with another depiction of the geometry 33, such as a depiction including one or more datums or other annotations (sec, e.g., FIG. 7). The viewing window 52-1 may be operable to display the depiction of the geometry 33 in response to selection of the respective view object 56. The preview window 52-3 may be operable to display a depiction of the geometry 33 associated with the respective view object 56 in response to user interaction. In implementations, a user may interact with the user interface 48 by positioning a cursor on or otherwise adjacent to the view object 56 to cause the preview window 52-3 to display the respective depiction (e.g., preview) of the geometry 33, which may be displayed in the viewing window 52-1 in response to selection of the view object 56 (e.g., mouse click).

The information window 52-4 may be operable to display information in the user interface 48. The information may be generic and/or may be associated with the geometry 33. The information window 52-4 may be dynamically linked to one or more of the geometric objects 54 such that selection of the geometric object 54 may cause information to update in the information window 52-4.

The modeling environment 28 may be operable to generate one or more content objects 58. The tessellated model(s) 36 may include the content object(s) 58. The content object(s) 58 may be operable to establish the information window 52-4. The content objects 58 may be operable to selectively display information associated with the tessellated model 36 and/or respective geometry 33 in a common display region 62 and/or another portion of the user interface 48. The content objects 58 may be operable to establish the information window 52-4 such that the common display region 62 may be spaced apart from, but may be concurrently displayed with, the viewing window 52-1 in response to opening the tessellated model 36 in the lightweight viewer 46.

The content objects 58 may be assigned various information, including information associated with the tessellated model 36. The information may be assigned to content fields 59 associated with the respective content objects 58 (FIG. 3). In implementations, the content fields 59 may be associated with information specified in a data structure (e.g., template) readable by the lightweight viewer 46. The lightweight file 37 may store the information in the data structure according to the API 50. In other implementations, the information may be stored directly in the respective content fields 59. The content field 59 may be a portion of the content object 58 or may be another object linked to the content object 58. Various techniques may be utilized to define the information associated with the content fields 59, including various data types or structures such as character, string, integer, boolean, array, date, time, etc. In implementations, the content fields 59 may contain code (e.g., script), which may be executable by the API 50 and/or lightweight viewer 46. The information assigned to the content objects 58 may be the same or may at least partially differ from information assigned to other content objects 58. The information may be associated with various details of the organization responsible for the CAD model 32. The information may include a revision history of the CAD model 32, various notes or statements associated with the CAD model 32, a bill of material (BOM) associated with component(s) represented by the geometry 33, etc. The content objects 58 may be operable to display information assigned to the respective content field 59 in respective portions of the information window 52-4.

The modeling environment 28 may be operable to generate one or more content layers 60. The layers 60 may be respective objects of the tessellated model 36. Each content object 58 may be associated with one or more of the layers 60. The content objects 58 may be assigned (e.g., occupy) the same view location in the user interface 48 but may be assigned to different layers 60 of the model 36. At least some of the layers 60 may occupy the common display region 62 of the user interface 48. The layers 60 may be dimensioned to at least partially, substantially, or completely overlap with each other in the common display region 62. The content objects 58 may be operable to selectively display information associated with the tessellated model 36 in response to user interaction with or selection of the respective content object 58 such that the respective layer 60 may be activated, but a remainder of the layers 60 may be deactivated in the common display region 62.

Various techniques may be utilized to establish the layers 60 in the user interface 48. The modeling environment 28 may be operable to establish a tabbed interface 66. The tabbed interface 66 may be utilized to display information relating to the geometry 33 and/or other aspects of the tessellated model 36. Each viewable tab of the tabbed interface 66 may be established by at least two objects. One object may be associated with the tab name (e.g., tab object 64) and another object may be associated with the respective information area (e.g., content object 58). The user may interact with a control object 71 in the user interface 48 to open a separate document containing a full listing of applicable tabs. Prior systems may include a model trec window having one or more tabs for displaying various information, such as a model tree, model views, product manufacturing information (PMI), etc., specified in a data stack. However, the model tree window may be provided by the application itself independent of any particular lightweight file, instead of being established by objects stored in the lightweight file.

The modeling environment 28 may be operable to generate one or more tab objects 64. The tessellated model 36 may include the tab objects 64. The information window 52-4 may be established by the tab object(s) 64 and control objects 58. The tab objects 64 may be operable to graphically depict the tabbed interface 66 in the information window 52-4 or another portion of the user interface 48. The tab objects 64 may be arranged in an array to graphically depict the tabbed interface 66. The tab objects 64 may be arranged in a row or may otherwise be offset from each other. The tabbed interface 66 may be directly adjacent to the common display region 62. The tab objects 64 may be associated with one or more content objects 58. Each tab object 64 may be associated with a respective layer 60 and one or more content objects 58 assigned to the layer 60. Each of the layers 60 and/or respective tab objects 64 may be associated with an activated state and a deactivated state. The tab objects 64 may be operable to graphically depict the current states in the user interface 48. The layers 60 may be made visible or invisible based on selection of the tab object 64. One layer 60 may be selectively visible at a time. Each of the tab objects 64 may be operable to selectively activate the layer 60 of the respective content object(s) 58 and deactivate a remainder of the layers 60 associated with the information window 52-4 in response to user interaction or other selection of the respective tab object 64.

Figure 5:
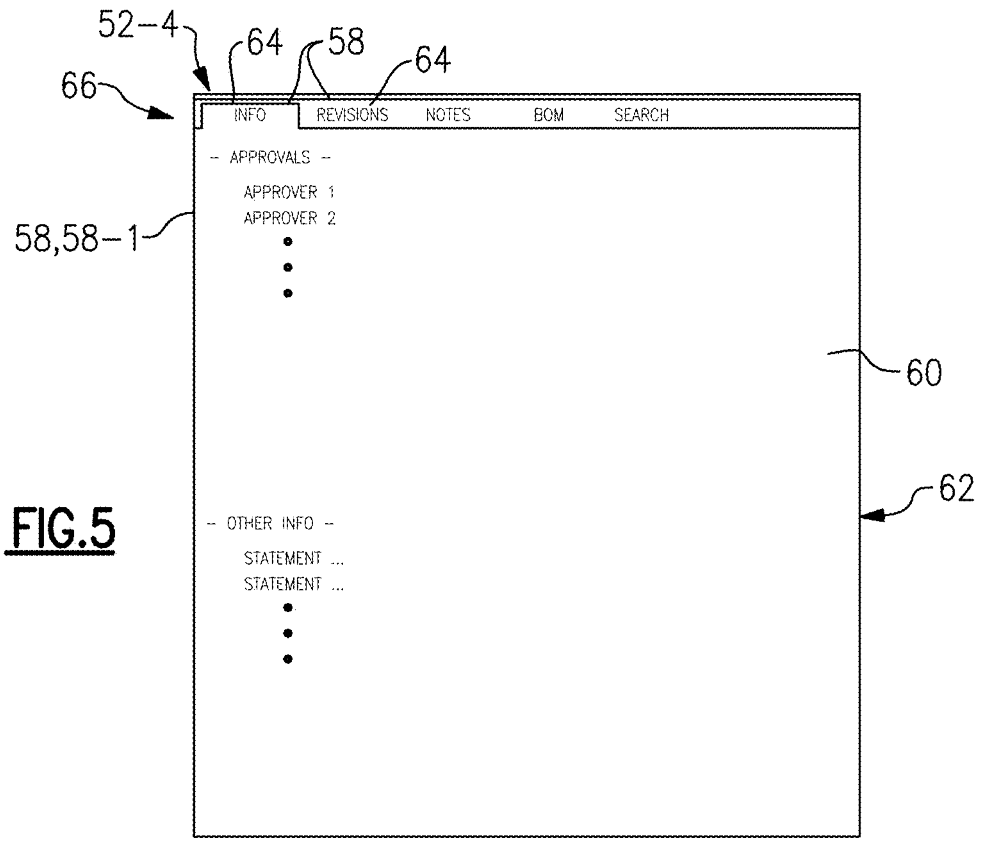
FIG. 5 discloses an arrangement of the user interface of FIG. 4A.

In the implementation of FIG. 5, the content objects 58 may include a first content object 58-1. The content object 58-1 may be associated with various information relating to personnel(s) and/or organization(s) assigned to designing, reviewing, manufacturing, etc., of the component(s), assembly or system.

Figure 4B:
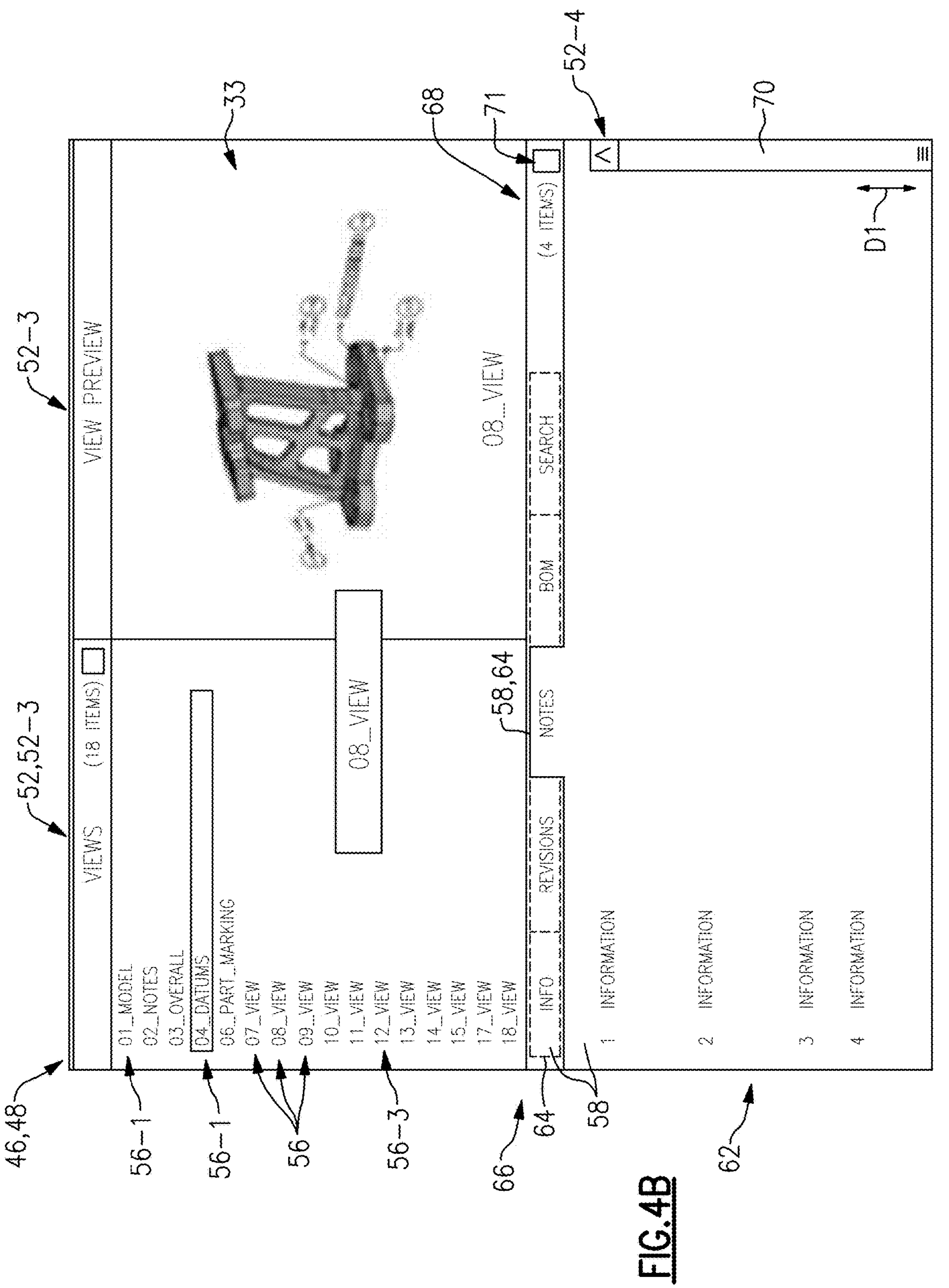
FIG. 4B discloses selected portions of the user interface of FIG. 4A.
Figure 6:
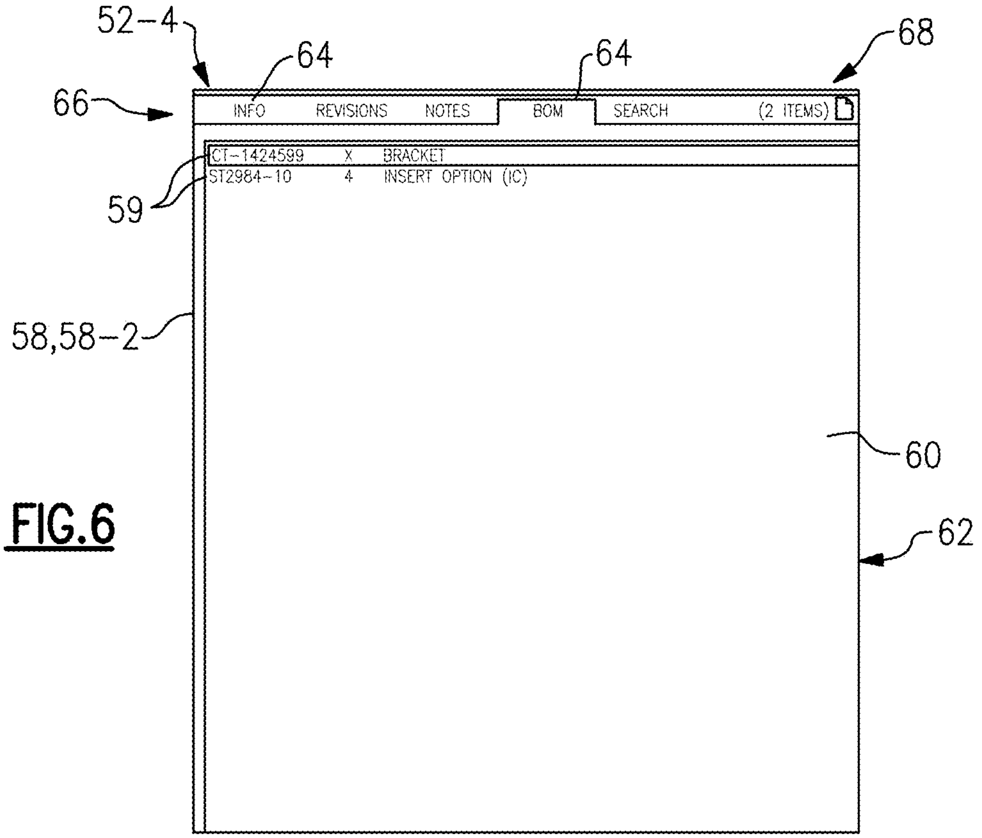
FIG. 6 discloses another arrangement of the user interface of FIG. 4A.

The modeling environment 28 may be operable to dynamically link one or more of the content objects 58 to one or more of the view objects 56 such that contents of a list or other information assigned to the content objects 58 may update in response to user interaction with or selection of the respective view objects 56. One or more of the content objects 58 may be dynamically linked to one or more of the view objects 56 such that the content fields 59 and/or other information assigned to the respective content objects 58 may update in response to selection of the respective view object 56. In the implementation of FIG. 6, the content objects 58 may include a second content object 58-2. The second content object 58-2 may be operable to display a bill of material (BOM) associated with the design. The content fields 59 of the associated content object 58-2 may be depicted graphically as a list. In implementations, the list may be an interactive list. The content fields 59 associated with the respective content object 58-2 may be dynamically linked to one or more of the respective view objects 56. Selection of a respective view object 56 from the navigation window 52-2 may cause the interactive list to update such that content of the content fields 59 associated with the respective content object 58 may be displayed in the common display region 62 according to the selected view object 56. The content displayed in the list may include unique identifiers (e.g., part numbers, names, descriptions, etc.) assigned to the associated geometric objects 54 and related information (see, e.g., FIGS. 4A-4B). In implementations, the content object 58-2 may include a content field associated with each of the respective geometric objects 54. The content object 58-2 may be operable to selective display of content in the content fields 59 in response to selection of the respective view object 56.

The information displayed in the information window 52-4 may include one or more statements. The statements may be established by one or more respective content fields 59. The content objects 58 may be operable to establish a list associated with a quantity of the statements assigned to the content fields 59 of the respective content object 58.

Each tab may be associated with a counter. The content objects 58 may be associated with a counter object 68 that may establish the counter. The counter object 68 may be arranged adjacent to the common display region 62. The counter object 68 may be operable to indicate a quantity of the statements assigned to the respective content objects 58 that may be currently indicated in the list.

Referring back to FIGS. 4A-4B, each tab may be associated with a control object 70 for interacting with information in the tabbed interface 66. The user may interact with the control object 70 to view the associated information, which may be useful in decluttering the information window 52-4 by reducing the size of the information area. One or more of the content objects 58 may be associated with the control object 70. The control object 70 may be adjacent to the common display region 62. The tessellated model 36 may include the control object 70. The control object 70 may be operable to cause a visible portion of the activated layer 60 to vary in response to user interaction. The control object 70 may be a scroll bar object. The scroll bar object 70 may be moveable in direction D1. The scroll bar object 70 may be manipulated by the user to view information displayed in the common display region 62. The counter object 68 may indicate that related content is available, which may be useful by suggesting that the user may interact with the scroll bar object 70 to view the additional information.

Figure 8:
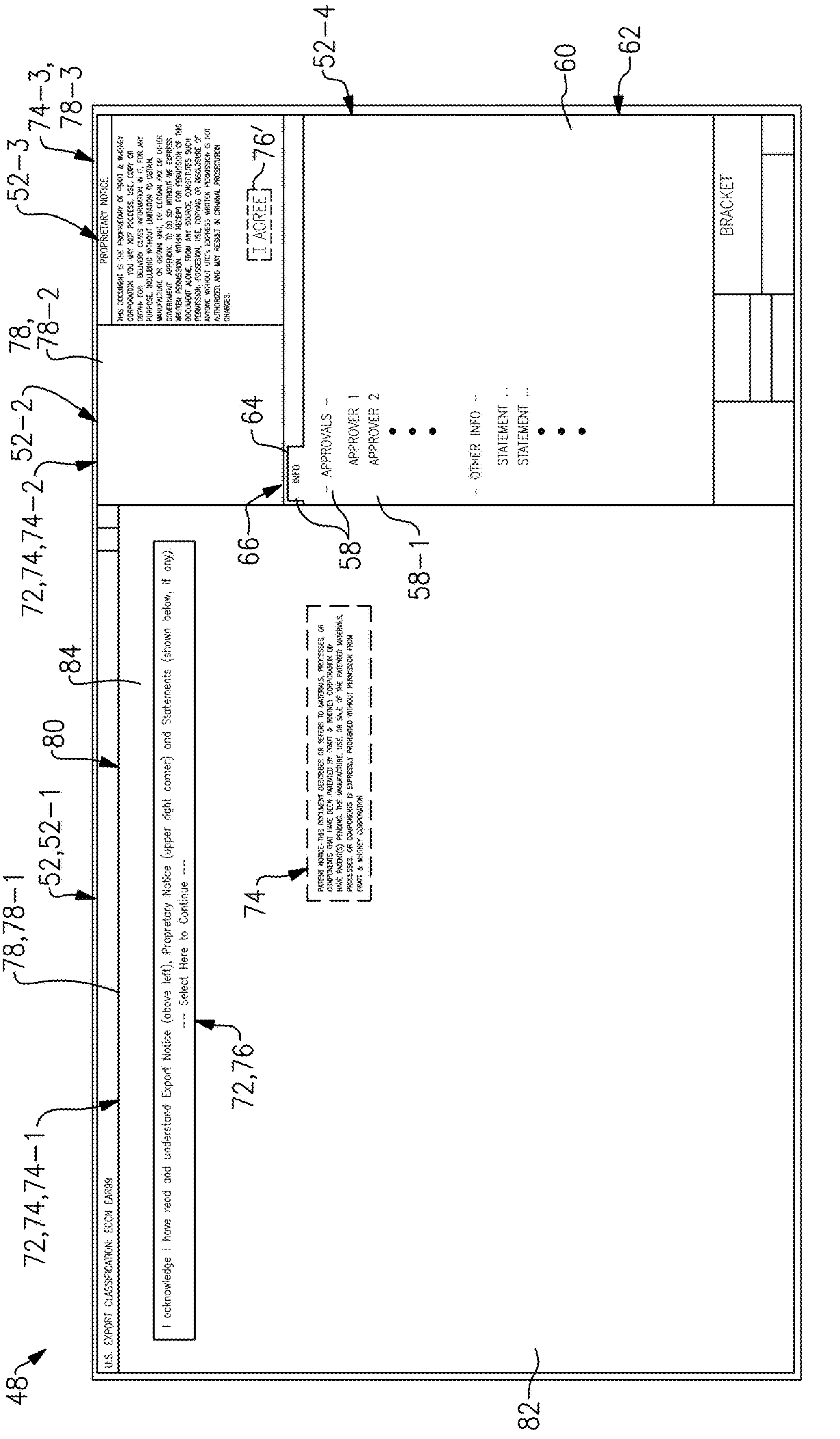
FIG. 8 discloses an arrangement of the user interface including notification screens.
Figure 9:
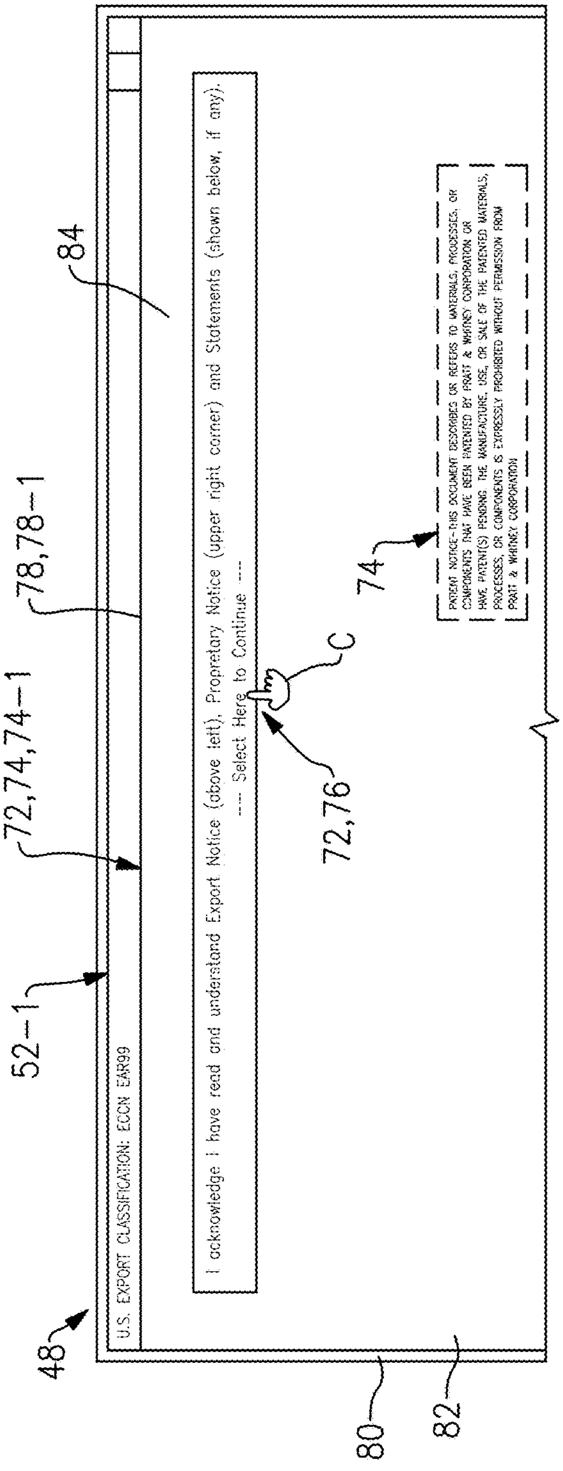
FIG. 9 discloses a portion of the user interface of FIG. 8.

Referring to FIGS. 8-9, with continuing reference to FIGS. 1 and 3, the tessellated model 36 may establish one or more notification screens (e.g., windows) that may be utilized to hide or otherwise obfuscate model geometry and other sensitive information in one or more display windows 52 of the user interface 48. The tessellated model 36 may include one or more notification objects 72. The modeling environment 28 may be operable to generate the tessellated model 36 to include the notification object(s) 72. The notification objects 72 may include one or more statement objects 74 and one or more acknowledgment objects 76. Each acknowledgment object 76 may be linked to one or more of the statement objects 74.

The statement objects 74 may establish one or more notification (e.g., cover) screens 78. The notification screen 78 may be dimensioned to substantially, or completely, occupy an area of the respective display window(s) 52. In implementations, the statement objects 74 may include a first statement object 74-1. The first statement object 74-1 may be operable to establish a first notification screen 78-1. The first notification screen 78-1 may block display of the geometry 33 and/or other content in the viewing window 52-1 prior to selection of the acknowledgment object 76 but may permit display of the geometry 33 and/or other content in the viewing window 52-1 in response to selection of the acknowledgment object 76. The user may interact with the user interface 48 directly or with an input device to select the acknowledgment object 76. In the implementation of FIG. 9, the user may position a curser C on, or otherwise adjacent to, the acknowledgment object 76 and may select the acknowledgment object 76 at the position of the curser C.

The first statement object 74-1 may be operable to display one or more notifications or statements in the first notification screen 78-1. The first notification screen 78-1 and the acknowledgment object 76 may be arranged in a common display region 80. The acknowledgment object 76 may be operable to deactivate the first notification screen 78-1 in response to selection of the acknowledgment object 76 (see, e.g., FIG. 4A). The acknowledgment object 76 may be operable to activate a depiction of the geometry 33 established by the geometric object(s) 54 in the viewing window 52-1 in response to selection of the acknowledgment object 76. The depiction activated by the acknowledgment object 76 may serve as a default depiction of the geometry 33. Various notifications may be utilized, including various export control and proprietary statements.

Figure 7:
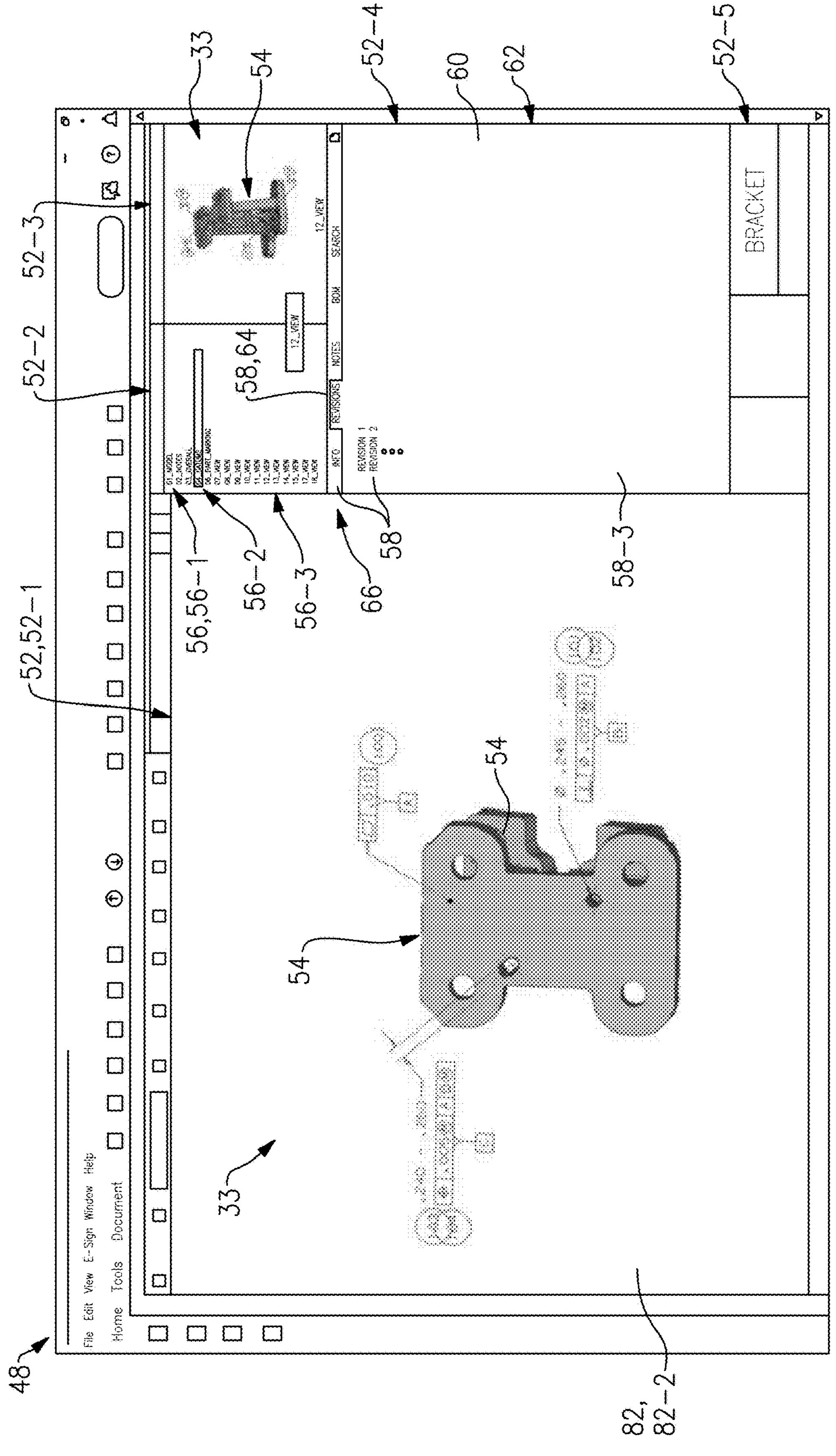
FIG. 7 discloses another depiction of the geometry in the user interface of FIG. 4A.

One or more geometric objects 54 may be associated with one or more display layers 82. The display layers 82 may be operable to depict the geometry 33 in the viewing window 52-1. In implementations, the tessellated model 36 may include display layers 82 associated with each depiction of the model geometry 33, including the depictions associated with the view objects 56. First and second display layers 82-1, 82-2 are illustrated in FIGS. 4A and 7, respectively. The first statement object 74-1 may be associated with a statement layer 84. The statement layer 84 may be operable to display statements and other information in the first notification screen 78-1. The display layer(s) 82 and statement layer 84 may be assigned to the common display region 80 of the user interface 48.

Each display layer 82 may have an activated state and a deactivated state. The assigned state may be specified in a field of the object. The display layer(s) 82 may be deactivated prior to selection of the acknowledgment object 76 such that the statement layer 84 may be displayed (e.g., as a default view) upon opening the tessellated model 36. In other implementations, the acknowledgement object 76 may be operable to deactivate at least one or more, or each, of the display layer 82 in response to opening the tessellated model 36.

The acknowledgement object 76 may be operable to block activation of the display layers 82 prior to selection of the acknowledgement object 76 but may be operable to permit activation of the display layers 82 in response to selection of the acknowledgement object 76. In implementations, the display layers 82 may include a default layer associated with a depiction of the geometry 33 established by one or more of the respective geometric objects 54 (e.g., FIG. 4A). In implementations, the first display layer 82-1 may serve as the default layer. The acknowledgment object 76 may be operable to activate the default layer 82 in response to selection of the acknowledgment object 76.

Each content layer 60 associated with the information window 52-4 may have an activated state and a deactivated state. The assigned state may be specified in a field of the object. The content layer(s) 60 may be deactivated prior to selection of the acknowledgment object 76. At least a portion of the tabbed interface 66 may be deactivate when opening the tessellated model 36. One or more of the tab objects 64 may be hidden from display prior to selection of the acknowledgment objects 76, but each of the tab objects 64 may be displayed in response to selection of the acknowledgment objects 76 (see, e.g., FIG. 4A).

In the implementation of FIG. 8, any tab object(s) 64 associated with the deactivated content layer(s) 60 may be hidden from display in the user interface 48 prior to selection of the acknowledgment object 76. The acknowledgement object 76 may be operable to block activation of the deactivated content layer(s) 60 prior to selection of the acknowledgement object 76 but may be operable to permit activation of the deactivated content layer(s) 60 in response to selection of the acknowledgement object 76. In implementations, the acknowledgement object 76 may be operable to cause the tab object(s) 64 associated with the deactivated content layer(s) 60 to be displayed in response to selection of the acknowledgement object 76 (sec, e.g., FIG. 4A). The user may interact with the tabbed interface 66 to select the activated tab object(s) 64 for viewing the information assigned to the associated content layer 60 (see, e.g., FIG. 7).

The tessellated model 36 may be operable to block or otherwise obfuscate other information in one or more display windows 52 of the user interface 48, including a preview of depictions of the model geometry 33. Each view object 56 may have an activated state and a deactivated state. The assigned state may be specified in a field of the object. The view object(s) 56 may be deactivated prior to selection of the acknowledgment object 76. In other implementations, the acknowledgement object 76 may be operable to deactivate at least one or more, or each, of the view objects 56 in response to opening the tessellated model 36.

The notification objects 72 may include a second statement object 74-2 and/or a third statement object 74-3 (FIG. 8). The statement objects 74-2, 74-3 may be linked to the acknowledgment object 76. The second statement object 74-2 may be operable to establish a second notification screen 78-2 that may block display of content in the navigation window 52-2, including one or more, or cach, of the view objects 56 prior to selection of the acknowledgment object 76. The third statement object 74-3 may be operable to establish a third notification screen 78-3 that may block display of content in the preview window 52-3 prior to selection of the acknowledgment object 76. In the implementation of FIG. 8, the third notification screen 78-3 may include one or more statements associated with the design, such as a proprietary notice. The notification object 72 may be operable to deactivate the notification screens 78-2. 78-3 in response to selection of the notification object 72. The notification object 72 may be operable to activate the view objects 56 in response to selection of the notification object 72 such that the view objects 56 may be displayed in the navigation window 52-2.

Although only one acknowledgment object 76 is shown in FIG. 8, it should be understood that more than one acknowledgment object 76 may be utilized in accordance with the teachings disclosed herein. In implementations, the user interface 48 may include two or more acknowledgments distributed at various locations of the user interface 48 (see, e.g., 76' indicated in dashed lines). The user may be prompted to select each statement and/or acknowledgment object 76, 76' in the notification screen 78 prior to deactivation of the notification screens 78.

Figure 10:
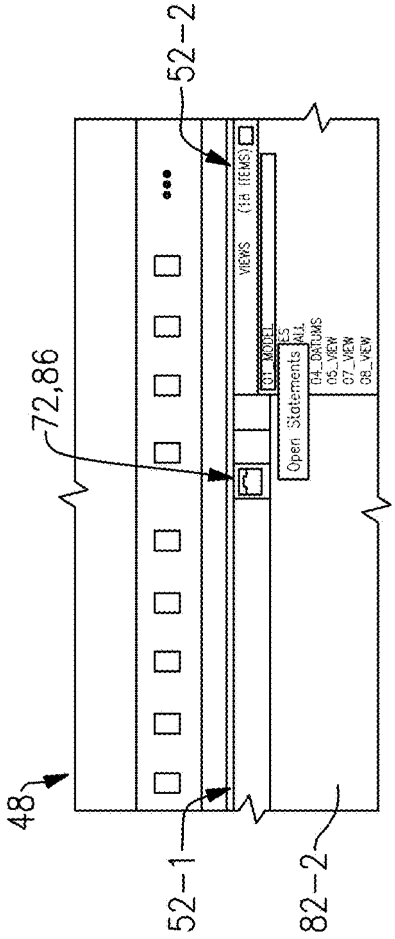
FIG. 10 discloses a portion of the user interface of FIG. 7.

Referring to FIG. 10, with continued reference to FIGS. 8 and 9, the tessellated model 36 may be operable to retrieve the notification screen(s) 78 to reference any of the acknowledged statements after they have been hidden. The notification objects 72 may include a review object 86. The review object 86 may be linked to the acknowledgment object 76. The review object 86 may be hidden prior to selection of the acknowledgment object 76 but may be displayed in response to the selection of the acknowledgment object 76. The review object 86 may be operable to cause the first notification screen 78-1 to be displayed in response to selection of the review object 86. The user may later view the notification screen(s) 78 by selecting the review object 86 in the user interface 48 (e.g., "Open Statements").

Figure 11:
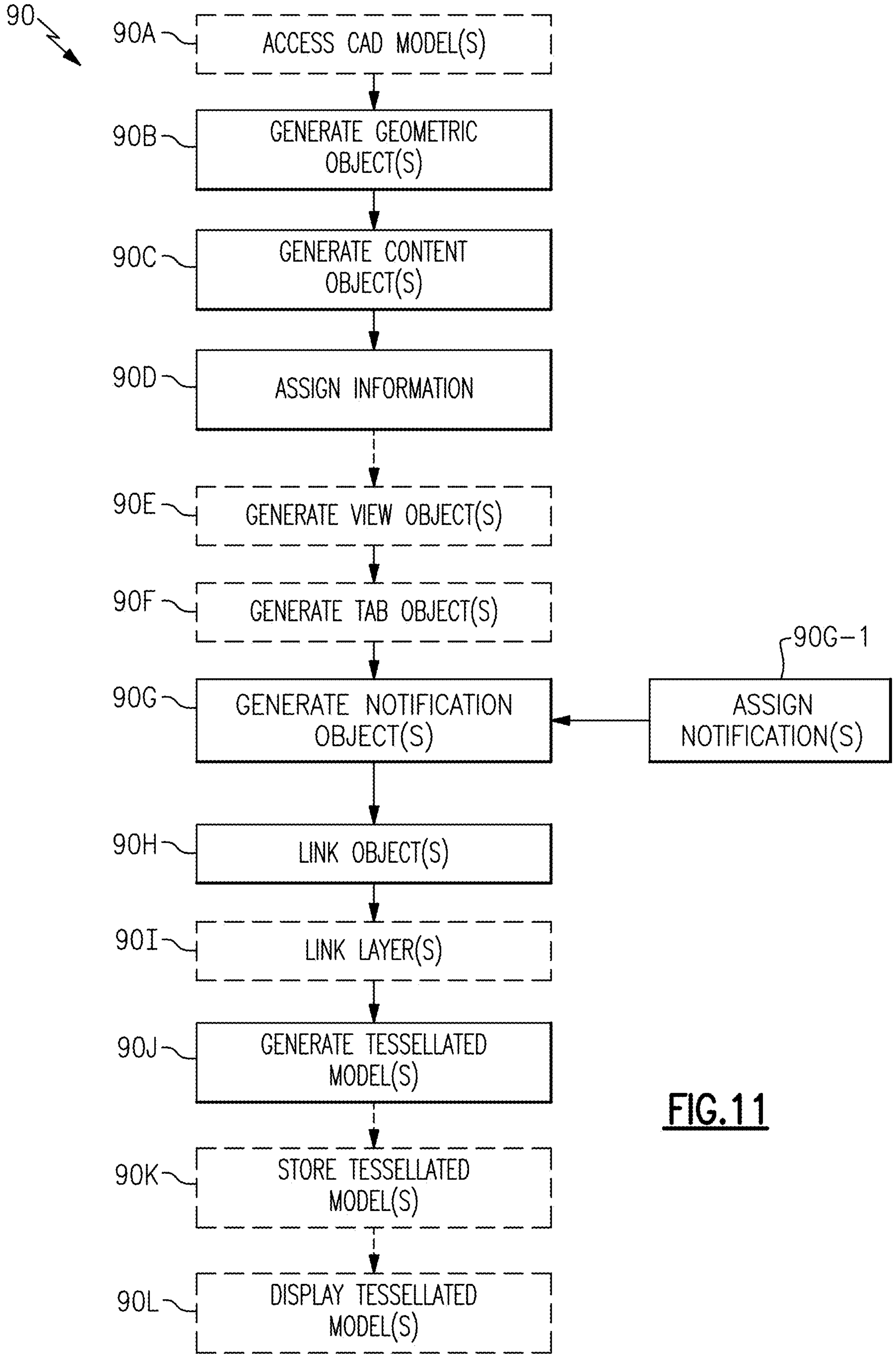
FIG. 11 discloses a method of generating a tessellated model.

FIG. 11 discloses a method of establishing and/or interacting with a tessellated model in a flow chart 90 according to an implementation. The method 90 may be utilized to generate one or more tessellated models associated with design geometry. The geometry may be defined in one or more associated CAD models. The tessellated models may exclude any CAD models associated with the geometry. Fewer or additional steps than are recited below could be performed within the scope of this disclosure, and the recited order of steps is not intended to limit this disclosure. The modeling environment 28 may be programmed with logic for performing method 90. Reference is made to the system 20.

Referring to FIG. 1, with continuing reference to FIG. 11, one or more CAD models 32 may be accessed at step 90A. The CAD model 32 may be associated with respective geometry 33. A CAD system 30 may be utilized to define the geometry 33 in the CAD model 32.

Referring to FIGS. 2-4A, with continuing reference to FIGS. 1 and 11, one or more geometric objects 54 may be generated at step 90B. The geometric objects 54 may establish a tessellation of the geometry 33, which may be stored in a tessellated model 36. The geometric objects 54 may be operable to display the tessellation of geometry 33 in the viewing window 52-1 and/or another display window 52 of the user interface 48.

Referring to FIGS. 3-4, with continuing reference to FIGS. 1 and 11, one or more content objects 58 may be generated at step 90C. The content objects 58 may be operable to establish the information window 52-4 of the user interface 48. Step 90C may include associating the content objects 58 with respective layers 60 that may occupy the common display region 62 of the user interface 48. The content objects 58 may be operable to establish the information window 52-4 such that the common display region 62 may be spaced apart from, but may be concurrently displayed with, the viewing window 52-1 in the user interface 48.

At step 90D, information associated with the geometry 33 and/or other information may be assigned to the content objects 58. In implementations, the information may be stored in one or more content fields 59. The information may be displayed utilizing any techniques disclosed herein. The content objects 58 may be operable to selectively display the respective information in the common display region 62 of the user interface 48.

At step 90E, one or more view objects 56 may be generated. The view objects 56 may be associated with respective depictions of the geometry 33.

At step 90F, one or more tab objects 64 may be generated. The tab objects 64 may be operable to depict the tabbed interface 66 in the information window 52-4. Each tab object 64 may be associated with one or more of the content objects 58.

Referring to FIG. 8, with continuing reference to FIGS. 1, 3 and 11, one or more notification objects 72 may be generated at step 90G. The notification objects 72 may include a first statement object 74-1 and an acknowledgment object 76. The acknowledgment object 76 may be linked to the first statement object 74-1. The first statement object 74-1 may be operable to establish a first notification screen 78-1 that may block display of content in the viewing window 52-1 prior to selection of the acknowledgment object 76 but may permit display of content in the viewing window 52-1 in response to selection of the acknowledgment object 76. The user may select or otherwise interact with the acknowledgment object 76 to perform the acknowledgement (see, e.g., "Select Here to Continue").

In implementations, generating the notification objects 72 may include assigning one or more notifications or statements to the respective statement objects 74, such as the first statement object 74-1, at step 90G-1. The first statement object 74-1 may be operable to display one or more of the assigned notifications in the first notification screen 78-1. The first notification screen 78-1 and the acknowledgment object 76 may be arranged in the common display region 80 of the user interface 48. The acknowledgment object 76 may be operable to deactivate the first notification screen 78-1 in response to selection of the acknowledgment object 76. The acknowledgment object 76 may be operable to activate a (e.g., default) depiction of the geometry 33 established by the respective geometric object(s) 54 in the viewing window 52-1 in response to selection of the acknowledgment object 76.

At step 90H, one or more of the objects may be linked to other object(s) of the tessellated model 36, including any of the objects disclosed herein. The objects may include the geometric objects 54, view objects 56, content objects 58, tab objects 64, counter objects 68, control objects 70, notification objects 72 and/or acknowledgment objects 76.

At step 90I, one or more of the objects may be linked to one or more respective layers 60, 82. Each of the tab objects 64 may be operable to selectively activate the layer 60 of the respective content object(s) 58 and deactivate the remainder of the layers 60 associated with the information window 52-4 and/or another portion of the user interface 48 in response to user interaction with or selection of the respective tab object 64. Each of the geometric objects 54 may be linked to one or more of the display layers 82. The notification object(s) 72 may be linked to the statement layer(s) 84.

At step 90J, one or more tessellated models 36 may be generated. The tessellated models 36 may be generated utilizing any of the techniques disclosed herein. The tessellated model 36 may include any of the objects and features disclosed herein, such as the geometric objects 54, content objects 58, tab objects 64, counter objects 68, control objects 70, notification objects 72 and/or acknowledgment objects 76.

Linking the objects at step 90H may include dynamically linking one or more of the content objects 58 to one or more of the view objects 56 such that the information assigned to the respective content object 58 may update in response to user action with the respective view object 56. In implementations, the content objects 58 may be operable to display a list of the information which may be dynamically updated in response to selection of the view object 56.

At step 90K, the tessellated model(s) 36 may be stored in one or more lightweight files 37. The files 37 may exclude the CAD model(s) 32 associated with the respective geometry 33.

At step 90L, the tessellated model(s) 36 may be displayed in a lightweight viewer 46. Step 90L may include establishing the user interface 48 in the display according to the objects of the tessellated model 36. The tessellated model 36 may cause the lightweight viewer 46 to execute code including one or more scripts, which may be specified in the content fields 59 of the content objects 58 or may otherwise be embedded in the tessellated model 36. Step 90L may include displaying one or more depictions of the geometry 33 in the display window(s) 52.

The systems and methods disclosed herein may be utilized to generate tessellated models associated with geometry of one or more components, assemblies and/or systems. The tessellated models may be stored in relatively compact files, which may be readable by a lightweight viewer provided to users who may not have access to a CAD system. The systems and methods disclosed herein may be utilized to cover or otherwise obfuscate model geometry and/or other sensitive information prior to the user acknowledging one or more statements. The disclosed techniques may deter users from referencing information they are not authorized to view. The notification screen may include any number of statements. The tessellated model may establish one or more notification screens or windows that may hide sensitive data in the display window(s) of a lightweight viewer until a user acknowledges that they have read all statements presented. The notification screen may be displayed until a user acknowledges that they have read all statements presented in the notification screen.

Although the different examples have the specific components shown in the illustrations, embodiments of this disclosure are not limited to those particular combinations. It is possible to use some of the components or features from one of the examples in combination with features or components from another one of the examples.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A user interface for a lightweight viewer comprising:

a viewing window operable to display geometry established by one or more of geometric objects of a tessellated model; and a plurality of notification objects of the tessellated model, wherein the notification objects include a first statement object and an acknowledgement object linked to the first statement object, wherein the first statement object is operable to establish a first notification screen that blocks display of the geometry in the viewing window prior to selection of the acknowledgement object but permits display of the geometry in response to selection of the acknowledgement object.

2. The user interface as recited in claim 1, wherein the first statement object is operable to display one or more notifications in the first notification screen, and the first notification screen and the acknowledgement object are arranged in a common display region.

3. The user interface as recited in claim 1, wherein the acknowledgement object is operable to deactivate the first notification screen in response to selection of the acknowledgement object.

4. The user interface as recited in claim 1, wherein:

the one or more geometric objects are associated with one or more display layers operable to depict the geometry in the viewing window;

the first statement object is associated with a statement layer operable to display information in the first notification screen;

the acknowledgement object is operable to block activation of the one or more of the display layers prior to selection of the acknowledgement object; and the acknowledgement object is operable to permit activation of the one or more display layers in response to selection of the acknowledgement object.

5. The user interface as recited in claim 4, wherein the one or more display layers includes a default layer associated with a depiction of the geometry established by the one or more of geometric objects, and the acknowledgement object is operable to activate the default layer.

6. The user interface as recited in claim 1, further comprising:

an information window established by a plurality of content objects of the tessellated model, the content objects associated with respective content layers of the tessellated model that occupy a common display region, the content objects operable to selectively display information associated with the tessellated model in response to user interaction with the respective content object such that the respective content layer is activated but a remainder of the content layers are deactivated in the common display region;

wherein one or more of the content layers are deactivated prior to selection of the acknowledgement object; and wherein the acknowledgement object is operable to block activation of the one or more of the content layers prior to selection of the acknowledgement object but is operable to permit activation of the one or more of the content layers in response to selection of the acknowledgement object.

7. The user interface as recited in claim 1, further comprising:

a navigation window operable to display one or more view objects, the one or more view objects associated with a respective depiction of the one or more geometric objects, and the tessellated model including the one or more view objects;

wherein the viewing window is operable to display the depiction in response to user interaction with the respective view object; and wherein the notification objects include a second statement object linked to the acknowledgement object, wherein the second statement object is operable to establish a second notification screen that blocks display of the one or more view objects in the navigation window prior to selection of the acknowledgement object.

8. The user interface as recited in claim 7, wherein the second statement object is operable to deactivate the second notification screen in response to selection of the acknowledgement object.

9. The user interface as recited in claim 7, wherein the notification objects include a review object linked to the acknowledgement object, the review object is hidden prior to selection of the acknowledgement object but is displayed in response to selection of the acknowledgement object, and the review object is operable to cause the first statement object to display the first notification screen in response to user interaction.

10. The user interface as recited in claim 1, wherein the tessellated model excludes any CAD model associated with the geometry.

11. A system for generating a tessellated model comprising:

a computing device including one or more processors coupled to memory;

wherein the computing device is operable to execute a modeling environment, and the modeling environment is operable to:

access a computer-aided design (CAD) model associated with geometry;

generate one or more geometric objects that establish a tessellation of the geometry;

generate a plurality of notification objects, the notification objects including a first statement object and an acknowledgement object linked to the first statement object;

generate a tessellated model including the one or more geometric objects and the notification objects;

wherein the one or more geometric objects are operable to display the tessellation of the geometry in a viewing window of a user interface; and wherein the first statement object is operable to establish a first notification screen that blocks display of the viewing window prior to selection of the acknowledgement object but permits display of the viewing window in response to selection of the acknowledgement object.

12. The system as recited in claim 11, wherein:

the acknowledgement object is operable to deactivate the first notification screen in response to selection of the acknowledgement object; and the acknowledgement object is operable to activate a depiction of the geometry established by the one or more of geometric objects in the viewing window in response to selection of the acknowledgement object.

13. The system as recited in claim 11, wherein the modeling environment is operable to:

generate one or more view objects associated with a navigation window of the user interface, the one or more view objects associated with a respective depiction of the one or more geometric objects, wherein the viewing window is operable to display the depiction in response to selection of the respective view object;

wherein the tessellated model includes the one or more view objects; and wherein the notification objects include a second statement object linked to the acknowledgement object, wherein the second statement object is operable to establish a second notification screen that blocks display of the one or more view objects in the navigation window prior to selection of the acknowledgement object.

14. The system as recited in claim 11, wherein the modeling environment is operable to:

generate a plurality of content objects;

wherein the tessellated model includes the content objects; and wherein the content objects are operable to establish an information window in the user interface, the content objects are associated with respective content layers of the tessellated model that occupy a common display region, and the content objects are operable to selectively display information associated with the tessellated model in the respective content layers;

wherein one or more content layers are deactivated prior to selection of the acknowledgement object; and wherein the acknowledgement object is operable to block activation of the one or more content layers prior to selection of the acknowledgement object but is operable to permit activation of the one or more content layers in response to selection of the acknowledgement object.

15. The system as recited in claim 11, wherein the modeling environment is operable to:

store the tessellated model in a file readable by a lightweight viewer, the file excluding the CAD model.

16. The system as recited in claim 15, wherein the modeling environment is operable to:

store code in the file that is operable to cause one or more functions associated with the tessellated model to execute in the lightweight viewer.

17. A method of establishing a tessellated model comprising:

generating one or more geometric objects that establish a tessellation of geometry stored in a computer-aided design (CAD) model, wherein the one or more geometric objects are operable to display the tessellation of the geometry in a viewing window of a user interface;

generating a plurality of notification objects, the notification objects including a first statement object and an acknowledgement object linked to the first statement object, wherein the first statement object is operable to establish a first notification screen that blocks display of the viewing window prior to selection of the acknowledgement object but permits display of the viewing window in response to selection of the acknowledgement object; and generating a tessellated model including the one or more geometric objects and the notification objects.

18. The method as recited in claim 17, further comprising:

assigning one or more notifications to the first statement object, wherein the first statement object is operable to display the one or more notifications in the first notification screen, and the first notification screen and the acknowledgement object are arranged in a common display region of the user interface.

19. The method as recited in claim 17, wherein:

the acknowledgement object is operable to deactivate the first notification screen in response to selection of the acknowledgement object; and the acknowledgement object is operable to activate a depiction of the geometry established by the one or more of geometric objects in the viewing window in response to selection of the acknowledgement object.

20. The method as recited in claim 17, further comprising:

storing the tessellated model in at least one file that excludes the CAD model.

21. The method as recited in claim 20, further comprising:

displaying the tessellated model in a lightweight viewer.

* * * * *